United States Patent
Morikazu et al.

(10) Patent No.: US 7,569,840 B2
(45) Date of Patent: Aug. 4, 2009

(54) ALIGNMENT METHOD OF A LASER BEAM PROCESSING MACHINE

(75) Inventors: Hiroshi Morikazu, Tokyo (JP); Eri Kawagishi, Tokyo (JP)

(73) Assignee: Disco Corporation, Tokyo (JP)

( * ) Notice: Subject to any disclaimer, the term of this patent is extended or adjusted under 35 U.S.C. 154(b) by 192 days.

(21) Appl. No.: 11/878,909

(22) Filed: Jul. 27, 2007

(65) Prior Publication Data

US 2008/0029715 A1 Feb. 7, 2008

(30) Foreign Application Priority Data

Aug. 2, 2006 (JP) .............................. 2006-210534

(51) Int. Cl.
- *H01L 21/78* (2006.01)
- *H01L 21/44* (2006.01)
- *G01N 23/00* (2006.01)
- *B21K 26/38* (2006.01)
- *B21K 26/06* (2006.01)

(52) U.S. Cl. .............. 250/491.1; 250/492.1; 219/121.6; 219/121.75; 438/462; 438/463

(58) Field of Classification Search ............... 250/491.1, 250/492.1, 492.2; 219/121.6, 121.67, 121.75, 219/121.83; 438/460, 462, 463
See application file for complete search history.

(56) References Cited

U.S. PATENT DOCUMENTS

| | | | |
|---|---|---|---|
| 6,777,820 B2 * | 8/2004 | Chiba et al. | ................. 257/797 |
| 7,179,723 B2 * | 2/2007 | Genda et al. | ................. 438/462 |
| 7,482,554 B2 * | 1/2009 | Furuta et al. | ........... 219/121.73 |
| 2003/0015806 A1 * | 1/2003 | Chiba et al. | ................. 257/797 |
| 2005/0106782 A1 * | 5/2005 | Genda et al. | ................. 438/118 |
| 2005/0155954 A1 * | 7/2005 | Oba et al. | .............. 219/121.67 |
| 2005/0205540 A1 * | 9/2005 | Iizuka | ................... 219/121.83 |
| 2006/0148210 A1 * | 7/2006 | Furuta et al. | ................. 438/460 |
| 2007/0045254 A1 | 3/2007 | Morikazu | |
| 2008/0029715 A1 * | 2/2008 | Morikazu et al. | ........ 250/491.1 |

FOREIGN PATENT DOCUMENTS

| | | |
|---|---|---|
| JP | 2003-163323 | 6/2003 |
| JP | 2007-67082 | 3/2007 |

\* cited by examiner

*Primary Examiner*—Bernard E Souw
(74) *Attorney, Agent, or Firm*—Smith, Gambrell & Russell, LLP (57) ABSTRACT

An alignment method of a laser beam processing machine comprising a chuck table, a laser beam application means having a condenser for applying a laser beam to the workpiece held on the chuck table, an image pick-up means for picking up an image of the workpiece held on the chuck table and a control means having a memory for storing the specifications of the workpiece, the method comprising the steps of storing the design coordinates of a processing position set based on the mark indicating the crystal orientation of a wafer and alignment marks; picking up an image of the periphery of the wafer with the image pick-up means and locating the mark indicating the crystal orientation of the wafer at a predetermined position; positioning the design coordinate position of each of the alignment marks set based on the mark indicating the crystal orientation of the wafer right below the condenser and applying a laser beam from the condenser so as to remove the insulating film in the alignment mark areas; and picking up an image of the alignment marks with the image pick-up means and adjusting the coordinates of the processing position of the wafer on the chuck table based on the image of the alignment marks.

1 Claim, 10 Drawing Sheets

ALIGNMENT METHOD OF A LASER BEAM PROCESSING MACHINE

FIELD OF THE INVENTION

The present invention relates to an alignment method of a laser beam processing machine for laser-processing a wafer having an insulating film coated on the processed surface of the substrate of a semiconductor wafer and the like.

DESCRIPTION OF THE PRIOR ART

In the production process of a semiconductor device, a plurality of areas are sectioned by dividing lines called "streets" arranged in a lattice pattern on the front surface of a substantially disk-like semiconductor wafer, and a device such as IC, LSI or the like is formed in each of the sectioned areas. Individual semiconductor chips are manufactured by cutting this semiconductor wafer along the streets to divide it into the areas having each a device formed therein.

To reduce the size and increase the number of functions of an apparatus, a modular structure for connecting the bonding pads of laminated devices composed of a plurality of semiconductor chips is disclosed by JP-A 2003-163323. This modular structure has such constitution that bonding pads are formed on the front surface of a semiconductor wafer, via holes reaching the bonding pads are formed from the rear surface side of the wafer at positions where the bonding pads are formed, and a conductive material such as aluminum to be connected to the bonding pads is embedded in the via holes.

The via holes formed in the above semiconductor wafer are generally formed by a drill. However, the diameters of the via holes formed in the semiconductor wafer are as small as 100 to 300 µm, and drilling the via holes is not always satisfactory in terms of productivity. In addition, as the thickness of each of the above bonding pads is about 1 to 5 µm, in order to form the via holes only in the substrate such as a silicon, forming the wafer without damaging the bonding pads, the drill must be controlled extremely accurately.

To solve the above problem, the applicant of the present application proposes as JP-A 2007-67082 a method of efficiently forming via holes reaching bonding pads in a wafer having a plurality of devices on the front surface of a substrate and having bonding pads on each of the devices, by applying a pulse laser beam from the rear surface side of the substrate.

Although a conductive material such as aluminum or copper is embedded in the via holes formed in the substrate as described above, when aluminum or copper is directly embedded in the via holes, there is a problem that aluminum or copper atoms diffuse into the inside of the substrate made of silicon to reduce the quality of each device. Therefore, after an insulating film is formed on the inner walls of the via holes, a conductive material such as aluminum or copper is embedded.

To form the insulating film on the inner walls of the via holes, there is proposed a method in which the rear surface or the front surface and rear surface of the substrate are coated with an insulating material to fill it into the via holes and then, a laser beam is applied to the center of the insulating film filled in the via holes to make a hole.

When the insulating material coated on the processed surface of the substrate is a material which cuts off visible radiation or infrared radiation, like an epoxy-based resin, alignment marks formed on the front surface of the substrate cannot be detected. Therefore, there is a problem that alignment work for positioning the wafer held on the chuck table at a predetermined location accurately cannot be carried out.

SUMMARY OF THE INVENTION

It is an object of the present invention to provide an alignment method of a laser beam processing machine, which, even if a wafer has an insulating film coated on the processed surface, enables the wafer held on a chuck table to be located at a predetermined position accurately.

To attain the above object, according to the present invention, there is provided an alignment method of a laser beam processing machine for laser-processing a wafer having a mark indicating crystal orientation at the outer periphery and an insulating film on the processed surface, the laser beam processing machine comprising a rotatable chuck table for holding a workpiece, a laser beam application means having a condenser for applying a laser beam to the workpiece held on the chuck table, a processing-feed means for moving the chuck table and the laser beam application means relative to each other in a processing-feed direction (X direction), an indexing-feed means for moving the chuck table and the laser beam application means in an indexing-feed direction (Y direction) perpendicular to the processing-feed direction, an image pick-up means for picking up an image of the workpiece held on the chuck table and a control means having a memory for storing the specifications of the workpiece, the method comprising:

a wafer specification storing step for storing the design coordinates of a processing position set based on the mark indicating the crystal orientation of a wafer and alignment marks;

a rough positioning step for picking up an image of the outer periphery of the wafer held on the chuck table with the image pick-up means and turning the chuck table to bring the mark indicating the crystal orientation of the wafer to a predetermined position;

an insulating film removing step for bringing the design coordinate position of each of the alignment marks set based on the mark indicating the crystal orientation of the wafer which has undergone the above rough positioning step to a position right below the condenser and activating the laser beam application means to applying a laser beam from the condenser so as to remove the insulating film in the alignment mark areas; and a precision positioning step for picking up an image of the alignment marks area, from which the insulating film has been removed by the insulating film removing step, with the image pick-up means and adjusting the coordinates of the processing position of the wafer on the chuck table based on the image of the alignment marks picked up.

In the alignment method of the laser beam processing machine according to the present invention, since the insulating film formed on the processed surface of the wafer in the areas of the alignment marks is removed by picking up an image of the mark indicating crystal orientation formed at the outer periphery of the wafer held on the chuck table and bringing the design coordinate positions of the alignment marks set based on this mark indicating crystal orientation to a position right below the condenser to apply a laser beam, an image of the alignment marks can be picked up. Therefore, even a wafer having an insulating film on the processed surface held on the chuck table can be located at the predetermined position accurately.

DETAILED DESCRIPTION OF THE PREFERRED EMBODIMENT

A preferred embodiment of the present invention will be described in detail hereinbelow with reference to the accompanying drawings.

Figure 1:
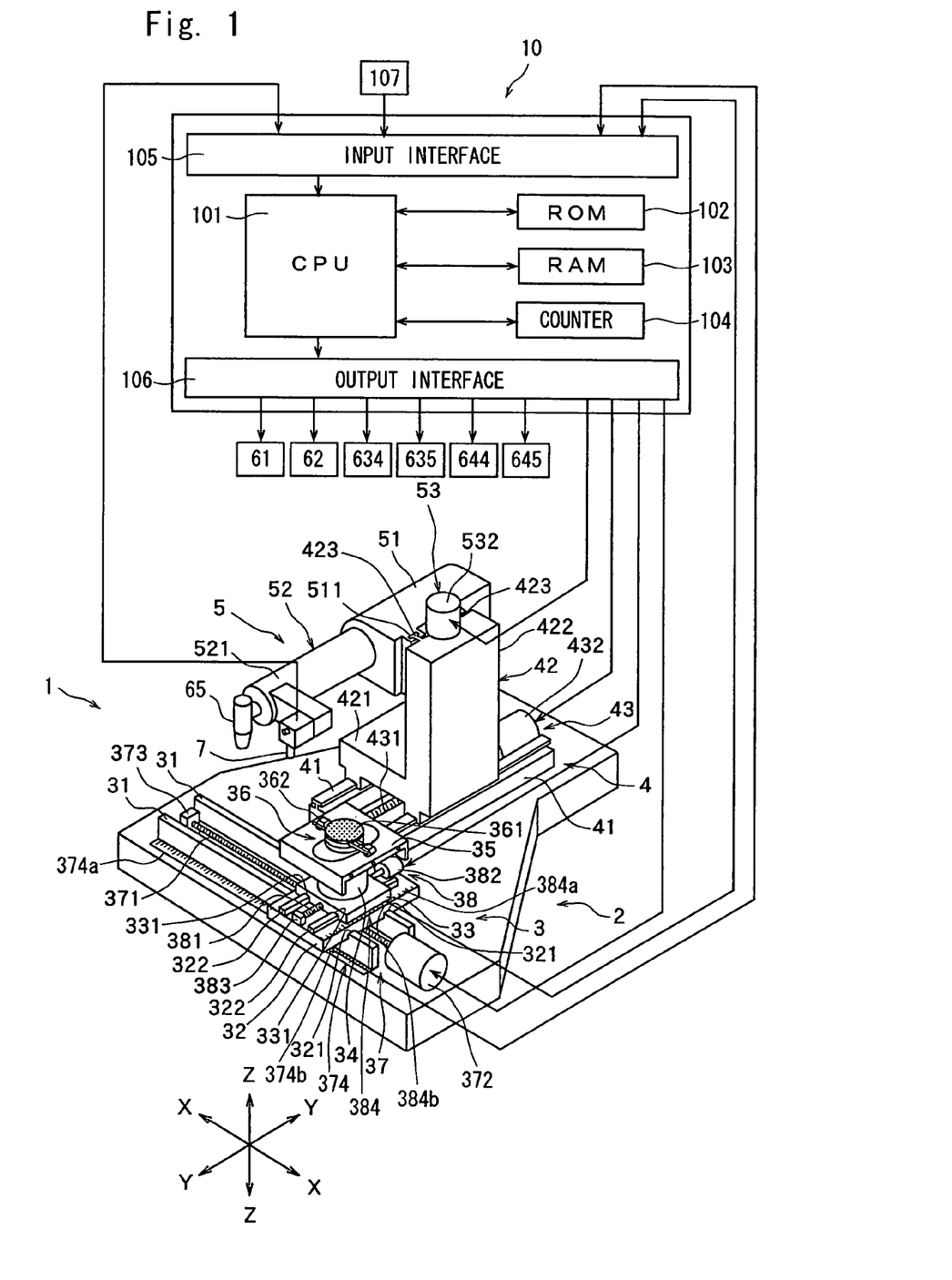
FIG. 1 is a perspective view of a laser beam processing machine for carrying out the alignment method of the present invention.

FIG. 1 is a perspective view of a laser beam processing machine for carrying out the alignment method of the present invention.

The laser beam processing machine 1 shown in FIG. 1 comprises a stationary base 2, a chuck table mechanism 3 for holding a workpiece, which is mounted on the stationary base 2 in such a manner that it can move in a processing-feed direction (X direction) indicated by an arrow X, a laser beam application unit support mechanism 4 mounted on the stationary base 2 in such a manner that it can move in an indexing-feed direction (Y direction) indicated by an arrow Y perpendicular to the direction indicated by the arrow X, and a laser beam application unit 5 mounted on the laser beam application unit support mechanism 4 in such a manner that it can move in a direction (Z direction) indicated by an arrow Z.

The above chuck table mechanism 3 comprises a pair of guide rails 31 and 31 mounted on the stationary base 2 and arranged parallel to each other in the processing-feed direction indicated by the arrow X, a first sliding block 32 mounted on the guide rails 31 and 31 in such a manner that it can move in the processing-feed direction indicated by the arrow X, a second sliding block 33 mounted on the first sliding block 32 in such a manner that it can move in the indexing-feed direction indicated by the arrow Y, a support table 35 supported on the second sliding block 33 by a cylindrical member 34, and a chuck table 36 as a workpiece holding means. This chuck table 36 has an adsorption chuck 361 made of a porous material, and a workpiece, for example, a disk-like semiconductor wafer is held on a holding surface which is the top surface of the adsorption chuck 361 by a suction means that is not shown. The chuck table 36 constituted as described above is rotated by a pulse motor (not shown) installed in the cylindrical member 34. The chuck table 36 is provided with clamps 362 for fixing an annular frame which will be described later.

The above first sliding block 32 has, on its undersurface, a pair of to-be-guided grooves 321 and 321 to be fitted to the above pair of guide rails 31 and 31 and, on the top surface, a pair of guide rails 322 and 322 formed parallel to each other in the indexing-feed direction indicated by the arrow Y. The first sliding block 32 constituted as described above can move along the pair of guide rails 31 and 31 in the processing-feed direction indicated by the arrow X by fitting the to-be-guided grooves 321 and 321 to the pair of guide rails 31 and 31, respectively. The chuck table mechanism 3 in the illustrated embodiment comprises a processing-feed means 37 for moving the first sliding block 32 along the pair of guide rails 31 and 31 in the processing-feed direction indicated by the arrow X. The processing-feed means 37 comprises a male screw rod 371 arranged between the above pair of guide rails 31 and 31 in parallel thereto, and a drive source such as a pulse motor 372 for rotary-driving the male screw rod 371. The male screw rod 371 is, at its one end, rotatably supported to a bearing block 373 fixed on the above stationary base 2 and is, at the other end, transmission-coupled to the output shaft of the above pulse motor 372. The male screw rod 371 is screwed into a threaded through-hole formed in a female screw block (not shown) projecting from the undersurface of the center portion of the first sliding block 32. Therefore, by driving the male screw rod 371 in a normal direction or adverse direction with the pulse motor 372, the first sliding block 32 is moved along the guide rails 31 and 31 in the processing-feed direction indicated by the arrow X.

The laser beam processing machine 1 in the illustrated embodiment comprises a processing-feed amount detection means 374 for detecting the processing-feed amount of the above chuck table 36. The processing-feed amount detection means 374 comprises a linear scale 374a arranged along the guide rail 31 and a read head 374b which is mounted on the first sliding block 32 and moves along the linear scale 374a together with the first sliding block 32. The read head 374b of this processing-feed amount detection means 374 supplies one pulse signal for every 1 μm to a control means which will be described later in the illustrated embodiment. The control means described later counts the input pulse signals to detect the processing-feed amount of the chuck table 36. When the pulse motor 372 is used as a drive source for the above processing-feed means 37, the processing-feed amount of the chuck table 36 can be detected by counting the drive pulses of the control means described later for outputting a drive signal to the pulse motor 372. When a servo motor is used as a drive source for the above processing-feed means 37, pulse signals outputted from a rotary encoder for detecting the revolution of the servo motor are supplied into the control means described later and the control means counts the pulse signals input, thereby making it possible to detect the processing-feed amount of the chuck table 36.

The above second sliding block 33 has, on its undersurface, a pair of to-be-guided grooves 331 and 331 to be fitted to the pair of guide rails 322 and 322 provided on the top surface of the above first sliding block 32 and can move in the indexing-feed direction indicated by the arrow Y by fitting the to-be-guided grooves 331 and 331 to the pair of guide rails 322 and 322, respectively. The chuck table mechanism 3 in the illustrated embodiment comprises a first indexing-feed means 38 for moving the second sliding block 33 along the pair of guide rails 322 and 322 on the first sliding block 32 in the indexing-feed direction indicated by the arrow Y. The first indexing-feed means 38 has a male screw rod 381 which is arranged between the above pair of guide rails 322 and 322 in parallel thereto and a drive source such as a pulse motor 382 for rotary-driving the male screw rod 381. The male screw rod 381 is, at its one end, rotatably supported to a bearing block 383 fixed on the top surface of the above first sliding block 32 and is, at the other end, transmission coupled to the output shaft of the above pulse motor 382. The male screw rod 381 is screwed into a threaded through-hole formed in a female screw block (not shown) projecting from the undersurface of the center portion of the second sliding block 33. Therefore, by driving the male screw rod 381 in a normal direction or adverse direction with the pulse motor 382, the second sliding block 33 is moved along the guide rails 322 and 322 in the indexing-feed direction indicated by the arrow Y.

The laser beam processing machine 1 in the illustrated embodiment has an indexing-feed amount detection means 384 for detecting the indexing-feed amount of the above second sliding block 33. This indexing-feed amount detection means 384 comprises a linear scale 384a arranged along the guide rail 322 and a read head 384b which is mounted on the second sliding block 33 and moves along the linear scale 384a together with the second sliding block 33. The read head 384b of the indexing-feed amount detection means 384 supplies one pulse signal for every 1 μm to the control means later described, in the illustrated embodiment. The control means later described counts the input pulse signals to detect the indexing-feed amount of the chuck table 36. When the pulse motor 382 is used as a drive source for the above first indexing-feed means 38, the indexing-feed amount of the chuck table 36 can be detected by counting the drive pulses of the control means later-described for outputting a drive signal to the pulse motor 382. When a servo motor is used as a drive source for the above first indexing-feed means 38, pulse signals outputted from a rotary encoder for detecting the revolution of the servo motor are supplied into the control means described later and the control means counts the pulse signals input, thereby making it possible to detect the processing-feed amount of the chuck table 36.

The above laser beam application unit support mechanism 4 has a pair of guide rails 41 and 41 mounted on the stationary base 2 and arranged parallel to each other in the indexing-feed direction indicated by the arrow Y and a movable support base 42 mounted on the guide rails 41 and 41 in such a manner that it can move in the direction indicated by the arrow Y. This movable support base 42 consists of a movable support portion 421 movably mounted on the guide rails 41 and 41 and a mounting portion 422 mounted on the movable support portion 421. The mounting portion 422 is provided with a pair of guide rails 423 and 423 extending parallel to each other in the direction indicated by the arrow Z on one of its flanks. The laser beam application unit support mechanism 4 in the illustrated embodiment comprises a second indexing-feed means 43 for moving the movable support base 42 along the pair of guide rails 41 and 41 in the indexing-feed direction indicated by the arrow Y. This second indexing-feed means 43 comprises a male screw rod 431 arranged between the above pair of guide rails 41 and 41 in parallel thereto, and a drive source such as a pulse motor 432 for rotary-driving the male screw rod 431. The male screw rod 431 is, at its one end, rotatably supported to a bearing block (not shown) fixed on the above stationary base 2 and is, at the other end, transmission-coupled to the output shaft of the above pulse motor 432. The male screw rod 431 is screwed into a threaded through-hole formed in a female screw block (not shown) projecting from the undersurface of the center portion of the movable support portion 421 constituting the movable support base 42. Therefore, by driving the male screw rod 431 in a normal direction or adverse direction with the pulse motor 432, the movable support base 42 is moved along the guide rails 41 and 41 in the indexing-feed direction indicated by the arrow Y.

The laser beam application unit 5 in the illustrated embodiment has a unit holder 51 and a laser beam application means 52 secured to the unit holder 51. The unit holder 51 has a pair of to-be-guided grooves 511 and 511 to be slidably fitted to the pair of guide rails 423 and 423 on the above mounting portion 422 and is supported in such a manner that it can move in the direction indicated by the arrow Z by fitting the to-be-guided grooves 511 and 511 to the above guide rails 423 and 423, respectively.

Figure 2:
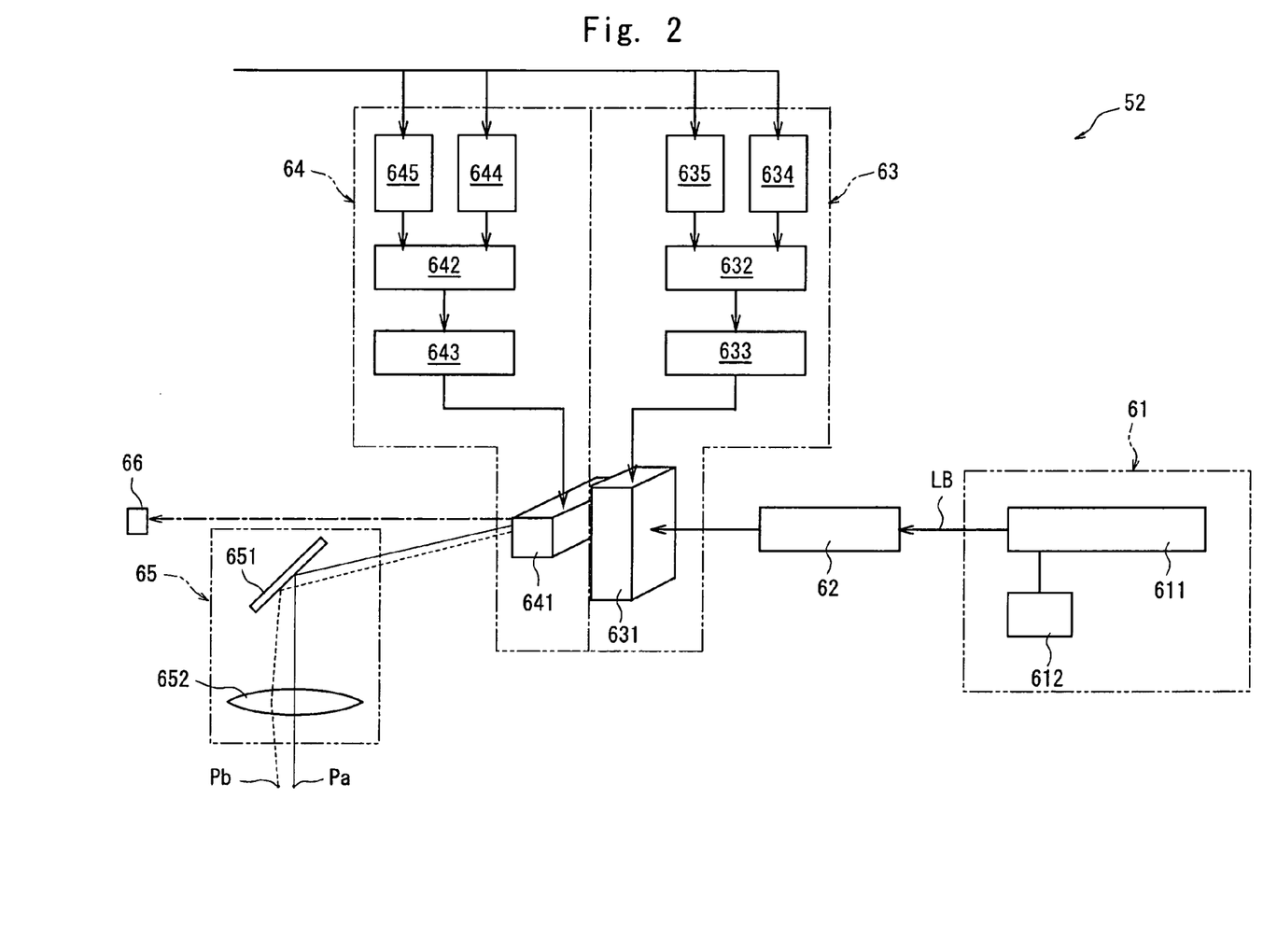
FIG. 2 is a constitution block diagram of a laser beam application means provided in the laser beam processing machine shown in FIG. 1.

The above laser beam application means 52 comprises a cylindrical casing 521 arranged substantially horizontally. As shown in FIG. 2, the laser beam application means 52 comprises a pulse laser beam oscillation means 61, an output adjustment means 62, a first acousto-optic deflection means 63 for deflecting the optical axis of a laser beam oscillated by the pulse laser beam oscillation means 61 in the processing-feed direction (X direction) and a second acousto-optic deflection means 64 for deflecting the optical axis of a laser beam oscillated by the laser beam oscillation means 61 in the indexing-feed direction (Y direction) all of which are installed in the casing 521, and a condenser 65 which is mounted on the end of the casing 521.

The above pulse laser beam oscillation means 61 is constituted by a pulse laser beam oscillator 611 and a repetition frequency setting means 612 connected to the pulse laser beam oscillator 611. The pulse laser beam oscillator 611 is composed of a YVO4 laser or YAG laser oscillator in the illustrated embodiment and oscillates a pulse laser beam LB of a wavelength (for example, 355 nm) having absorptivity for a workpiece made of silicon and the like. The above output adjustment means 62 adjusts the output of the pulse laser beam LB oscillated from the pulse laser beam oscillation means 61 to a predetermined output value.

The above first acousto-optic deflection means 63 has a first acousto-optic device 631 for deflecting the optical axis of a laser beam oscillated from the laser beam oscillation means 61 in the processing-feed direction (X direction), a first RF oscillator 632 for generating RF (radio frequency) to be applied to the first acousto-optic device 631, a first RF amplifier 633 for amplifying the power of RF generated by the first RF oscillator 632 to apply it to the first acousto-optic device 631, a first deflection angle adjusting means 634 for adjusting the frequency of RF generated by the first RF oscillator 632, and a first output adjusting means 635 for adjusting the amplitude of RF generated by the first RF oscillator 632. The above first acousto-optic device 631 can adjust the deflection angle of the optical axis of a laser beam according to the frequency of the applied RF and the output of a laser beam according to the amplitude of the applied RF. The above first deflection angle adjusting means 634 and the above first output adjusting means 635 are controlled by the control means that will be described later.

The above second acousto-optic deflection means 64 comprises a second acousto-optic device 641 for deflecting the optical axis of a laser beam oscillated from the laser beam oscillation means 61 in the indexing-feed direction perpendicular to the processing-feed direction (X direction), a second RF oscillator 642 for generating RF to be applied to the second acousto-optic device 641, a second RF amplifier 643 for amplifying the power of RF generated by the second RF oscillator 642 to apply it to the second acousto-optic device 641, a second deflection angle adjusting means 644 for adjusting the frequency of RF generated by the second RF oscillator 642, and a second output adjusting means 645 for adjusting the amplitude of RF generated by the second RF oscillator 642. The above second acousto-optic device 641 can adjust the deflection angle of the optical axis of a laser beam according to the frequency of the applied RF and the output of a laser beam according to the amplitude of the applied RF. The above second deflection angle adjusting means 644 and the above second output adjusting means 645 are controlled by the control means later described.

Further, the laser beam application means 52 in the illustrated embodiment has a laser beam absorbing means 66 for absorbing a laser beam not deflected by the first acousto-optic device 631 as shown by the one-dot chain line in FIG. 2 when RF is not applied to the above first acousto-optic device 631.

The above condenser 65 has a direction changing mirror 651 for changing the direction of a pulse laser beam passing through the above first acousto-optic deflection means 63 and the second acousto-optic deflection means 64 to a downward direction and a condenser lens 652 for converging a laser beam whose direction has been changed by the direction changing mirror 651.

The laser beam application means 52 in the illustrated embodiment is constituted as described above. When RF is not applied to the first acousto-optic device 631 and the second acousto-optic device 641, a pulse laser beam oscillated from the pulse laser beam oscillation means 61 is guided to the laser beam absorbing means 65 through the output adjustment means 62, the first acousto-optic device 631 and the second acousto-optic device 641 as shown by the one-dot chain line in FIG. 2. Meanwhile, when RF having a frequency of, for example, 10 kHz is applied to the first acousto-optic device 631, the optical axis of a pulse laser beam oscillated from the pulse laser beam oscillation means 61 is deflected and focused at a focal point Pa as shown by the solid line in FIG. 2. Further, when RF having a frequency of, for example, 20 kHz is applied to the first acousto-optic device 631, the optical axis of a pulse laser beam oscillated from the pulse laser beam oscillation means 61 is deflected and focused at a focal point Pb which shifts from the above focal point Pa by a predetermined distance in the processing-feed direction (X direction) as shown by the broken line in FIG. 2. When RF having a predetermined frequency is applied to the second acousto-optic device 641, the optical axis of a pulse laser beam oscillated from the pulse laser beam oscillation means 61 is focused at a focal point which shifts from the above focal point Pa by a predetermined distance in the indexing direction (Y direction: perpendicular to the sheet in FIG. 2) perpendicular to the processing-feed direction (X direction).

Figure 3:
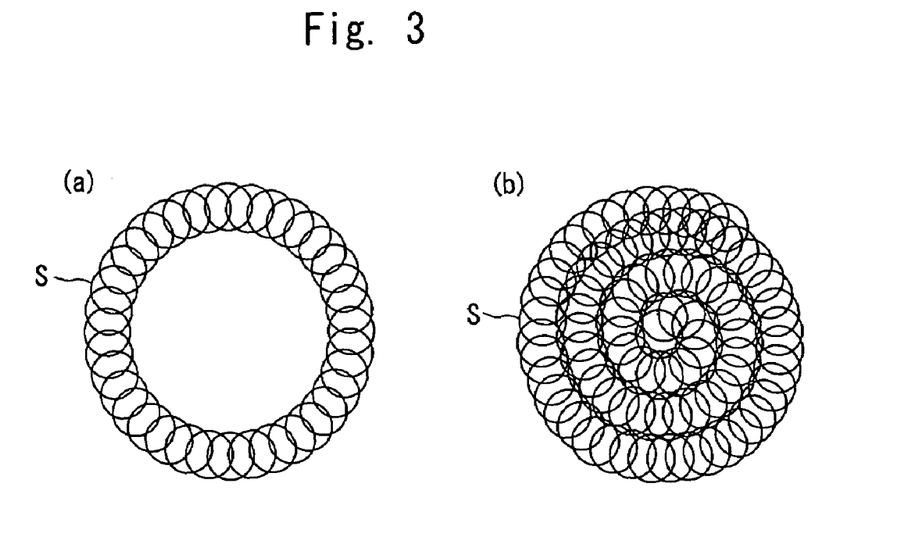
FIGS. 3(a) and 3(b) are explanatory diagrams showing trepanning process which is carried out by the laser beam application means shown in FIG. 2.

Therefore, trepanning processing for moving the spot S of the pulse laser beam circularly as shown in FIG. 3(a) or spirally as shown in FIG. 3(b) can be carried out by activating the first acousto-optic deflection means 63 and the second acousto-optic deflection means 64 to deflect the optical axis of the pulse laser beam in the X direction and Y direction sequentially.

Returning to FIG. 1, an image pick-up means 7 for detecting the area to be processed by the laser beam application means 52 is mounted on the end portion of the casing 521 constituting the above laser beam application means 52. This image pick-up means 7 comprises an infrared illuminating means for applying infrared radiation to the workpiece, an optical system for capturing infrared radiation applied by the infrared illuminating means, and an image pick-up device (infrared CCD) for outputting an electric signal corresponding to infrared radiation captured by the optical system, in addition to an ordinary image pick-up device (CCD) for picking up an image with visible radiation. An image signal picked-up is supplied to the control means later described.

The laser beam application unit 5 in the illustrated embodiment comprises a focal point positioning means 53 for moving the unit holder 51 along the pair of guide rails 423 and 423 in the direction indicated by the arrow Z (direction perpendicular to the holding surface which is the top surface of the adsorption chuck 361). The focal point positioning means 53 comprises a male screw rod (not shown) arranged between the pair of guide rails 423 and 423 and a drive source such as a pulse motor 532 for rotary-driving the male screw rod. By driving the male screw rod (not shown) in a normal direction or adverse direction with the pulse motor 532, the unit holder 51 and the laser beam application means 52 comprising the condenser 65 are moved along the guide rails 423 and 423 in the direction indicated by the arrow Z. In the illustrated embodiment, the laser beam application means 52 is moved up by driving the pulse motor 532 in a normal direction and moved down by driving the pulse motor 532 in the adverse direction.

The laser beam processing machine 1 in the illustrated embodiment has the control means 10. The control means 10 is composed of a computer comprising a central processing unit (CPU) 101 for carrying out arithmetic processing based on a control program, a read-only memory (ROM) 102 for storing the control program, etc., a read/write random access memory (RAM) 103 for storing the results of operations, a counter 104, an input interface 105, an output interface 106 and an input means 107. Detection signals from the above processing-feed amount detection means 374, the indexing-feed amount detection means 384 and the image pick-up means 7 are supplied to the input interface 105 of the control means 10. Control signals are supplied to the above pulse motor 372, the pulse motor 382, the pulse motor 432, the pulse motor 532, the pulse laser beam oscillation means 61 and the output adjustment means 62 of the pulse laser beam application means 52, the first deflection angle adjusting means 634 and the first output adjusting means 635 constituting the first acousto-optic deflection means 63, and the second deflection angle adjusting means 644 and the second output adjusting means 645 constituting the second acousto-optic deflection means 64 from the output interface 106 of the control means 10. The specifications later-described of the wafer as the workpiece are input from the input means 107 and stored in the above random access memory (RAM) 103.

The illustrated laser beam processing machine 1 is constituted as described above, and its function will be described hereinbelow.

Figure 4:
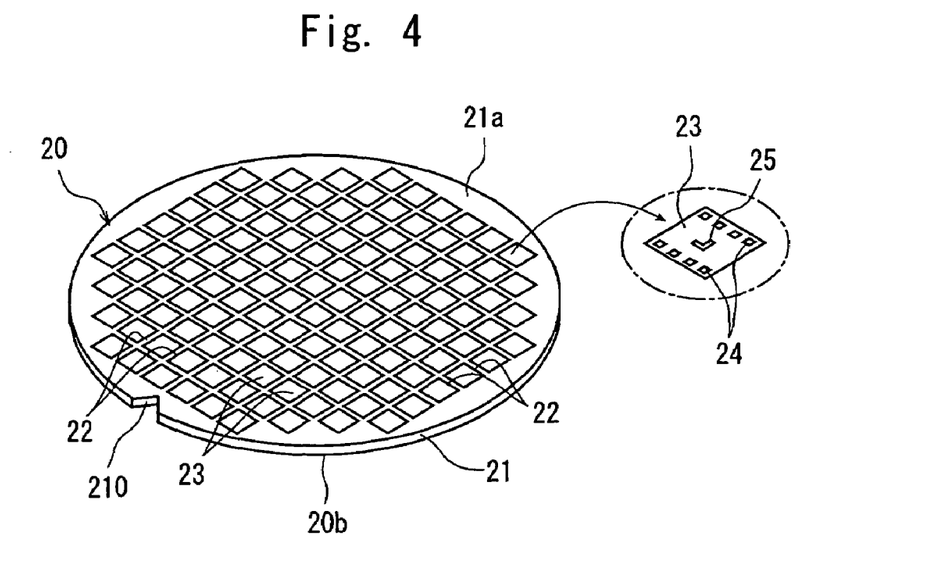
FIG. 4 is a perspective view of a semiconductor wafer as a workpiece.
Figure 5:
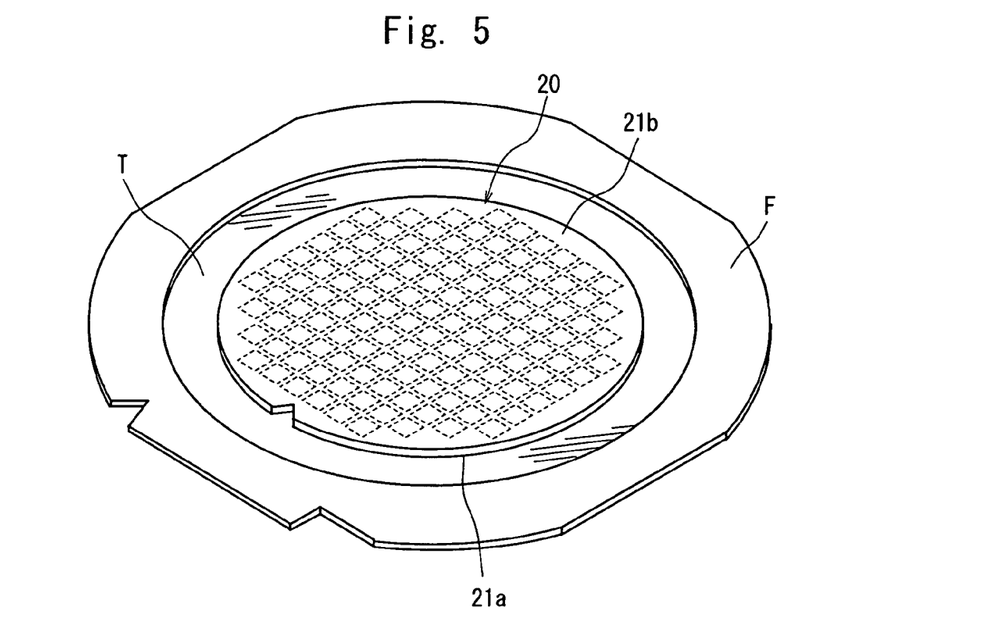
FIG. 5 is a perspective view showing a state where the semiconductor wafer shown in FIG. 4 is put on the front surface of a protective tape mounted on an annular frame.

FIG. 4 is a perspective view of a semiconductor wafer 20 as the wafer. In the semiconductor wafer 20 shown in FIG. 4, a plurality of areas are sectioned by a plurality of streets 22 arranged in a lattice pattern on the front surface 21a of a substrate 21 which is made of silicon and has a thickness of, for example, 100 µm and a notch 210 as a mark indicating crystal orientation at the outer periphery, and a device 23 such as IC, LSI or the like is formed in each of the sectioned areas. The devices 23 are the same in constitution. A plurality of bonding pads 24 are formed on the surface of each device 23. The bonding pads 24 are made of a metal material such as aluminum, copper, gold, platinum or nickel and have a thickness of 1 to 5 µm. An area characterized by the constitution of a circuit is existent on the front surface of each device 23 and serves as an alignment mark 25 in the illustrated embodiment. The front surface 21a side of the semiconductor wafer 20 formed as described above is put on a protective tape T composed of a synthetic resin sheet such as a polyolefin sheet mounted on an annular frame F, as shown in FIG. 5. Therefore, the rear surface 21b of the semiconductor wafer 20 faces up.

As described above, the specifications of the semiconductor wafer 20, that is, the design values of the coordinates of the notch 210 formed at the outer periphery of the substrate 21 and the plurality of streets 22 formed on the front surface 21a of the substrate 21 and the design values based on the notch 210 of the coordinates of the plurality of bonding pads 24 (processing positions) formed on each of the devices 23 and the alignment marks 25 are input from the input means 107 of the above control means 10 and stored in the random access memory (RAM) 103 (wafer specification storing step).

A description is subsequently given of the processing method for forming a via hole in the bonding pad 24 portion of the semiconductor wafer 20 by using the above laser beam processing machine 1.

The protective tape T side of the semiconductor wafer 20 supported to the annular frame F through the protective tape T as shown in FIG. 5 is placed on the chuck table 36 of the laser beam processing machine 1 shown in FIG. 1. The semiconductor wafer 20 is suction-held on the chuck table 36 through the protective tape T by activating the suction means that is not shown. The annular frame F is fixed by the clamps 362.

Figure 6:
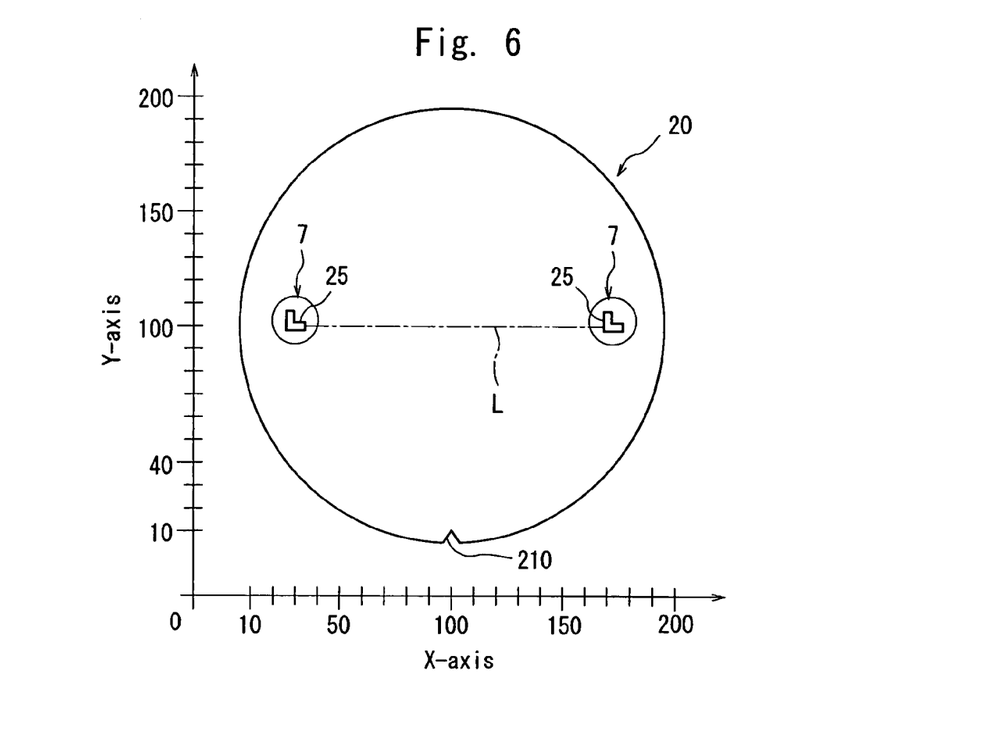
FIG. 6 is an explanatory diagram showing alignment work for the semiconductor wafer held on the chuck table of the laser beam processing machine shown in FIG. 1.

The chuck table 36 suction-holding the semiconductor wafer 20 as described above is brought to a position right below the image pick-up means 7 by the processing-feed means 37. Then, alignment work for bringing the semiconductor wafer 20 held on the chuck table 36 to a predetermined position is carried out. In this alignment work, as shown exaggeratedly in FIG. 6, an image of two alignment marks 25 in the X direction is picked up by the image pick-up means 7 and it is judged whether a straight line L connecting the two alignment marks 25 is parallel to the X axis or not. When the above straight line L is not parallel to the X axis, the chuck table 36 is turned so that the straight line L becomes parallel to the X axis. Although the front surface 21a having the alignment marks 25 of the semiconductor wafer 20 faces down at this point, as the image pick-up means 7 comprises the infrared illuminating means, an optical system for capturing infrared radiation and an image pick-up device (infrared CCD) for outputting an electric signal corresponding to the infrared radiation as described above, an image of the alignment marks 25 can be picked up through the rear surface 21b.

Figure 7:
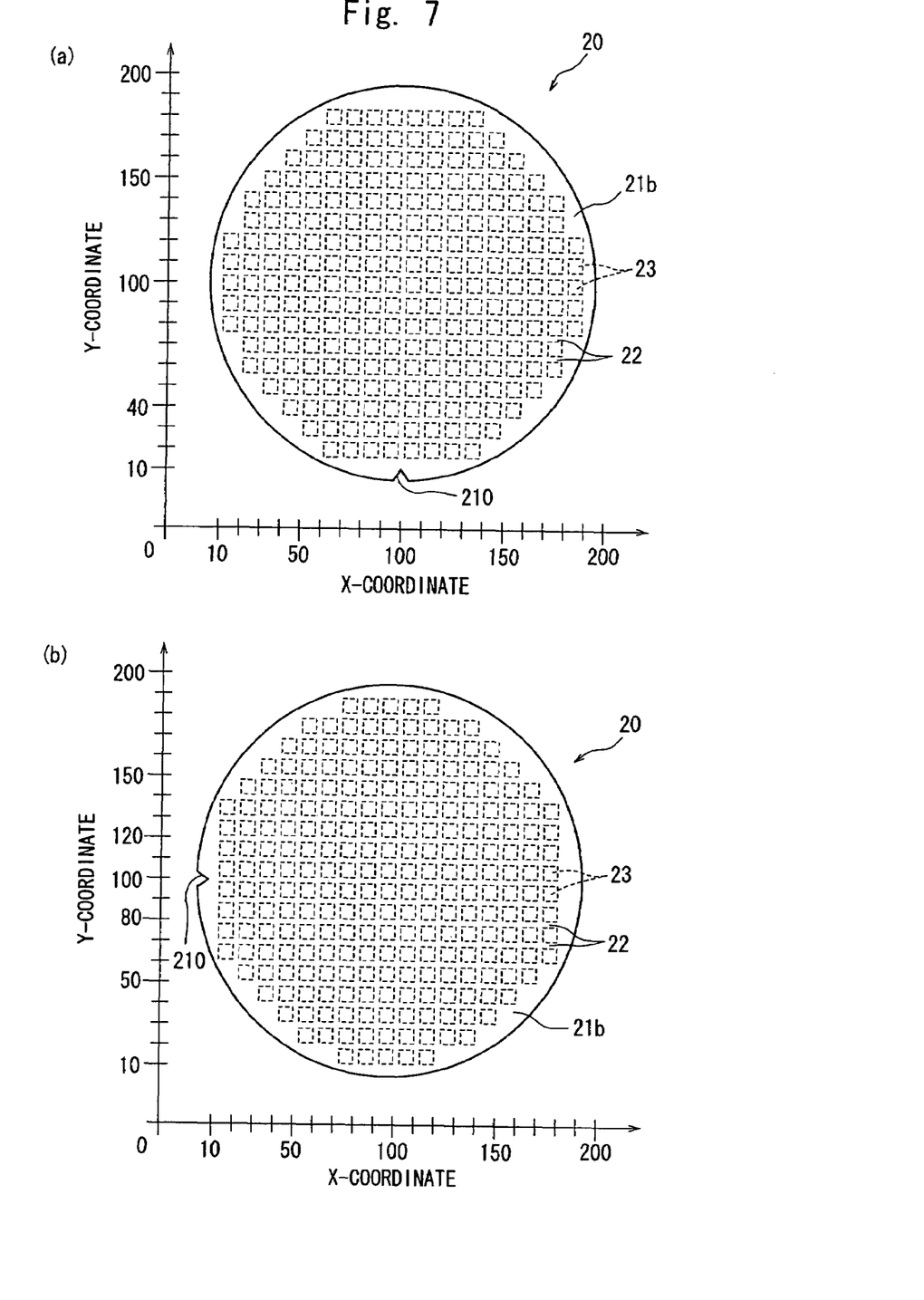
FIGS. 7(a) and 7(b) are explanatory diagrams showing the relationship between the semiconductor wafer shown in FIG. 4 and its coordinate position in a state where the wafer has been held at a predetermined position of the chuck table of the laser beam processing machine shown in FIG. 1.

After the above alignment is carried out, the semiconductor wafer 20 suction-held on the chuck table 36 becomes a state where it is located at a predetermined coordinate position shown in FIG. 7(a). FIG. 7(b) shows a state where the chuck table 36, that is, the semiconductor wafer 20 is turned at 90° from the state shown in FIG. 7(a).

Figure 8:
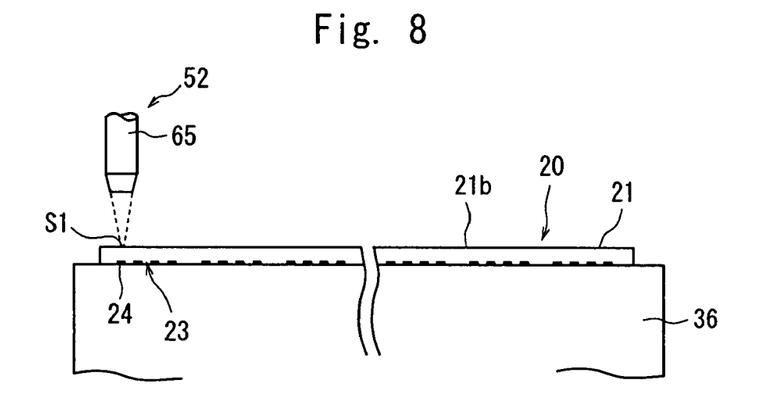
FIG. 8 is an explanatory diagram showing a first hole forming step which is carried out by using the laser beam processing machine shown in FIG. 1.

After the above alignment work is carried out, the chuck table 36 is moved as shown in FIG. 8 to bring a device 23 at the most left end in FIG. 8 out of the plurality of devices 23 formed in a predetermined direction on the substrate 21 of the semiconductor wafer 20, to a position right below the condenser 65. Then, a bonding pad 24 at the most left end out of the plurality of bonding pads 24 formed on the device 23 at the most left end in FIG. 8 is brought to a position right below the condenser 65.

Next comes the step of forming a first hole reaching the bonding pad 24 from the rear surface 21b side of the substrate 21 by activating the laser beam application means 52 to apply a pulse laser beam to the rear surface 21b side of the substrate 21 of the semiconductor wafer 20 from the condenser 65 of the laser beam application means 52. To carry out this first hole forming step, RF having a frequency of 10 kHz, for example, is applied to the first acousto-optic device 631 of the first acousto-optic deflection means 63 such that the optical axis of the pulse laser beam LB oscillated from the pulse laser beam oscillation means 61 is focused at the focal point Pa as shown by the solid line in FIG. 2.

Thereafter, a pulse laser beam is set to have a spot diameter of 0.75 to 0.9D when the diameter of the via hole to be formed is represented by D, and the pulse laser beam set to have an energy density per pulse of 40 to 60 J/cm$^2$ is applied from the rear surface 21b side of the substrate 21 of the semiconductor wafer 20. That is, the energy density of the pulse laser beam applied from the condenser 65 of the laser beam application means 52 is set to a level (40 to 60 J/cm$^2$ per pulse) which can process a semiconductor substrate made of silicon efficiently but hardly processes the bonding pad 24 made of metal. A predetermined number of pulses of the pulse laser beam are applied to the rear surface 21b side of the substrate 21.

The processing conditions in this first hole forming step are set as follows.

Figure 9:
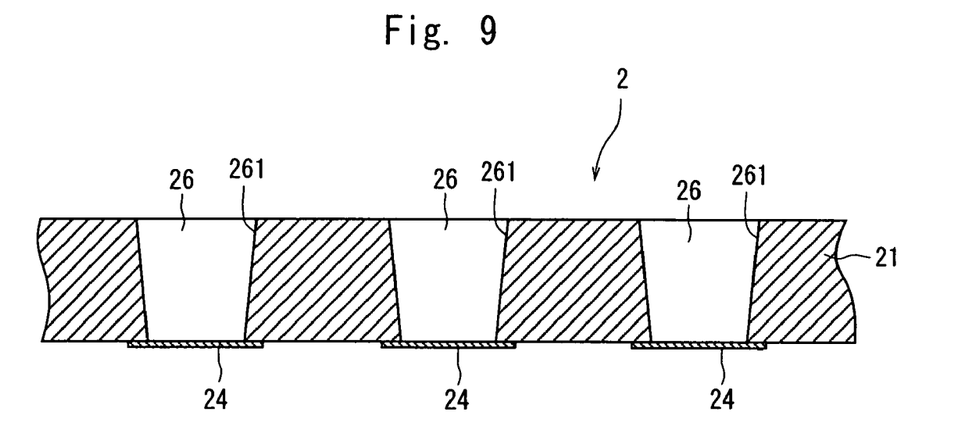
FIG. 9 is a partially enlarged sectional view of the semiconductor wafer having first holes which have been formed by the first hole forming step shown in FIG. 8.

Light source of laser beam: YVO4 laser or YAG laser
Wavelength: 355 nm
Repetition frequency: 50 kHz
Energy density per pulse: 50 J/cm$^2$
Spot diameter: 100 µm Under the above processing conditions, when the substrate 21 of the semiconductor wafer 20 is made of silicon, as shown in FIG. 8, a hole having a depth of 2 µm can be formed with one pulse of the pulse laser beam by setting a spot S1 having the above spot diameter to the rear surface 21b (top surface) of the substrate 21. Therefore, by applying 50 pulses of the pulse laser beam, a first hole 26 reaching the bonding pad 24 from the rear surface 21b of the substrate 21 is formed as shown in FIG. 9. The above first hole forming step is carried out at positions corresponding to all the bonding pads 24.

The inner wall 261 of the hole 26 formed as described above is tapered from the rear surface 21b side of the substrate 21 toward the front surface 21a. When the spot diameter of the pulse laser beam is 100 µm, the diameter on the rear surface 21b side of the substrate 21 of the first hole 26 is about 120 µm. Therefore, the spot diameter of the pulse laser beam is preferably 0.75 to 0.9D when the diameter of the via hole to be formed is represented by D.

When the above first hole forming step is carried out, the pulse laser beam used to form the hole is slightly applied to the rear surface of the bonding pad 24. Although the energy density of the pulse laser beam applied in the first hole forming step is set to a level (40 to 60 J/cm$^2$ per pulse) which can process a semiconductor substrate made of silicon but hardly processes a metal as described above, metal atoms forming the bonding pad 24 are slightly scattered to become metal contaminants which may adhere, by electrostatic force, to the inner tapered surface 261, which is the inner wall of the first hole 26, in some cases. The metal contaminants adhering to the inner wall 261 of the first hole 26 are desirably removed because they diffuse into the inside of the substrate 21 to reduce the quality of each device 23.

In the illustrated embodiment, a cleaning step for cleaning the inner walls 261 of the first holes 26 is carried out in the above first hole forming step by applying a pulse laser beam to the inner walls 261 (tapered surface) of the first holes 26 formed in the substrate 21. In this cleaning step, trepanning processing for applying a pulse laser beam along the tapered surface 261 is carried out.

The processing conditions in the cleaning step are set as follows.

Figure 10:
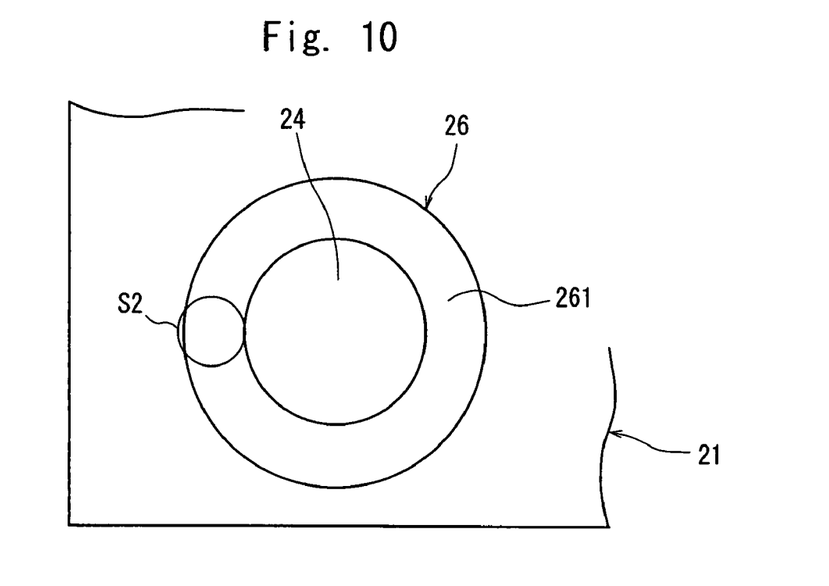
FIG. 10 is an explanatory diagram showing a cleaning step which is carried out by using the laser beam processing machine shown in FIG. 1.

Light source of laser beam: YVO4 laser or YAG laser
Wavelength: 355 nm
Repetition frequency: 50 kHz
Energy density per pulse: 3 to 20 J/cm$^2$
Spot diameter: 0.2 to 0.3D when the diameter of the via hole to be formed is represented by D To carry out the cleaning step under the above processing conditions, as shown in FIG. 10, the spot S2 of a pulse laser beam applied from the condenser 65 of the above laser beam application means 52 is adjusted so as to be positioned at the inner wall 261 (tapered surface) of the first hole 26 formed in the substrate 21. The laser beam application means 52 is activated to carry out trepanning process as shown in FIG. 3(a). It is important that the center (the position of the peak of a Gaussian distribution) of the spot S2 of the pulse laser beam should not be applied to the bonding pad 24 at this point. As a result, the pulse laser beam is applied along the inner wall 261 (tapered surface) of the first hole 26 formed in the substrate 21 to remove the trace metal contaminants adhering to the inner wall 261 (tapered surface) by electrostatic force. Since the energy density of the pulse laser beam applied in this cleaning step is low, the substrate 21 is not processed.

Figure 11:
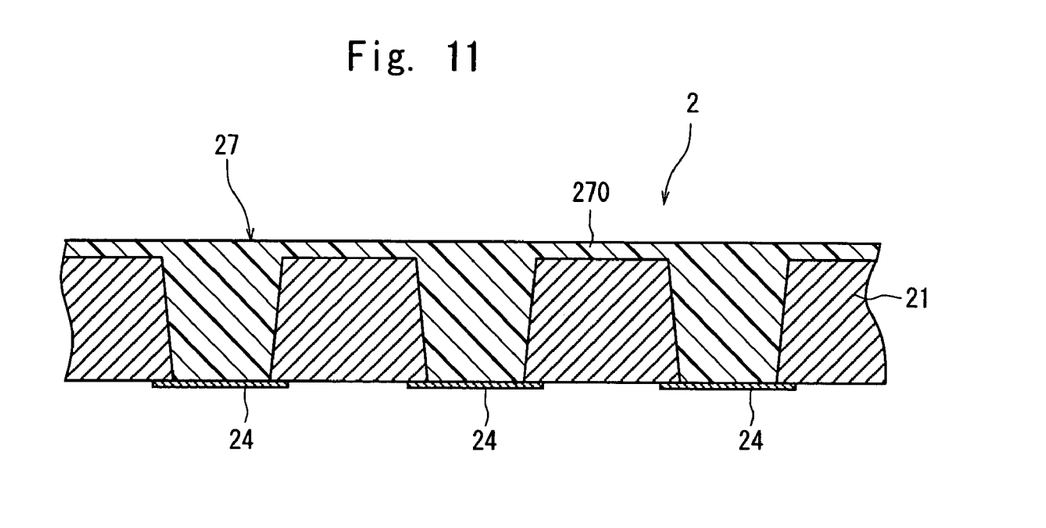
FIG. 11 is a partially enlarged sectional showing a state where an insulating material has been filled into the first holes by applying an insulating material to the rear surface of the semiconductor wafer which has undergone the first hole forming step and the cleaning step.

After the above cleaning step, next comes the step of filling an insulating material into the first holes 26 formed in the substrate 21 of the semiconductor wafer 20 in the above first hole forming step. That is, the semiconductor wafer 20 which has undergone the above first hole forming step and the cleaning step is detached from the chuck table 36 of the laser beam processing machine 1 in a state where it is supported to the annular frame F through the protective tape T, and carried to a resin coating apparatus that is not shown. An epoxy-based resin as the insulating material is coated to the rear surface 21b, which is the processed surface of the substrate 21 of the semiconductor wafer 20, by the resin coating apparatus (not shown) to fill the epoxy-based resin insulating material 27 into the first holes 26 formed in the substrate 21 as shown in FIG. 11. The insulating material 27 which is an epoxy-based resin is coated to the rear surface 21b of the substrate 21 to a thickness of 20 to 30 µm to form an insulating film 270.

After the above insulating material filling step, next comes the step of forming a second hole reaching the bonding pad 24 in the insulating material 27 by applying a pulse laser beam to the insulating material 27 filled in the first holes 26 formed in the substrate 21. This second hole forming step is carried out by using the above laser beam processing machine 1.

That is, the protective tape T side of the semiconductor wafer 20 which has undergone the above insulating material filling step is placed on the chuck table 36 of the laser beam processing machine 1 shown in FIG. 1 in a state that it is put on the protective tape T mounted on the annular frame F. The semiconductor wafer 20 is suction-held on the chuck table 36 through the protective tape T by activating the suction means that is not shown. The annular frame F is fixed by the clamps 362.

After the semiconductor wafer 20 is suction-held on the chuck table 36 as described above, alignment work for detecting the area to be processed of the semiconductor wafer 20 is carried out. Since the insulating film 270 made of an epoxy-based resin is formed on the rear surface 21a of the substrate 21 of the semiconductor wafer 20 and does not transmit visible radiation and infrared radiation, an image of the alignment marks 25 existent on the front surface 21a of the substrate 21 of the semiconductor wafer 20 cannot be picked up by the above image pick-up means 7. Then, in the present invention, alignment work for positioning the semiconductor wafer 20 on the chuck table 36 at a predetermined location is carried out as follows.

Figure 12:
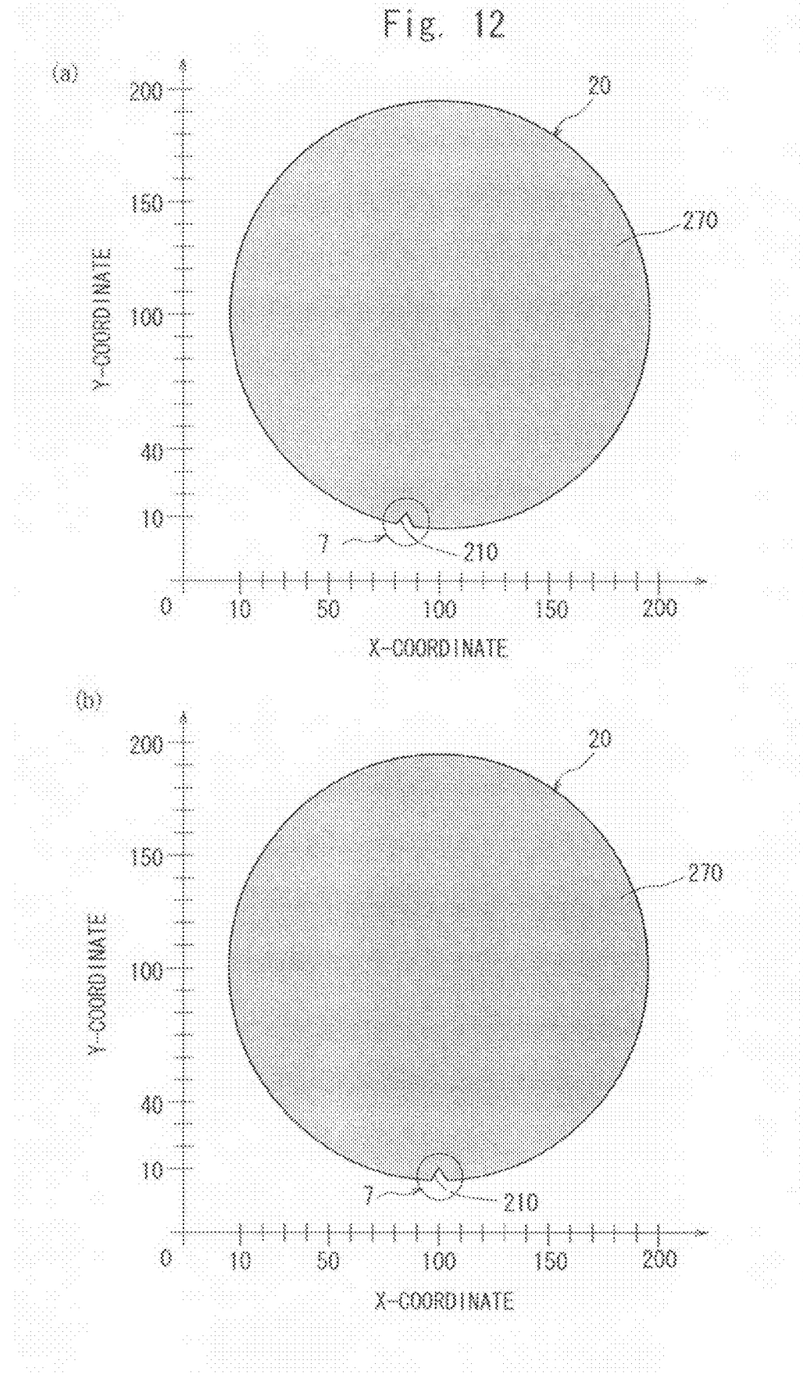
FIGS. 12(a) and 12(b) are explanatory diagrams showing the rough positioning step in the alignment method of the present invention.

The chuck table 36 is first activated to bring the outer peripheral portion of the semiconductor wafer 20 to a position right below the image pick-up means 7 as shown in FIG. 12(a). The chuck table 36 is turned while an image of the outer peripheral portion of the semiconductor wafer 20 is picked up by the image pick-up means 7, the control means 10 obtains the smallest value of the Y-axis coordinate of the notch 210 formed at the outer periphery of the semiconductor wafer 20 based on an image signal from the image pick-up means 7, and the chuck table 36 is turned so as to locate the notch 210 at a position (predetermined position) where its Y-axis coordinate value becomes the smallest as shown in FIG. 12(b) (rough positioning step). Although the semiconductor wafer 20 suction-held on the chuck table 36 is theoretically located at the coordinate position shown in FIG. 7(a) by carrying out this rough positioning step, it may slightly shift from the above position in the turning direction in some cases. When the second hole forming step for applying a pulse laser beam to the insulating material filled in the first holes 26 formed in the substrate 21 of the semiconductor wafer 20 is carried out in a state where this shift occurs, the second holes reach the inner walls of the first holes 26, thereby making it impossible to form an insulating film on the inner walls of the first holes 26.

In the present invention, the step of precisely positioning the semiconductor wafer 20 is carried out after the above rough positioning step.

Figure 13:
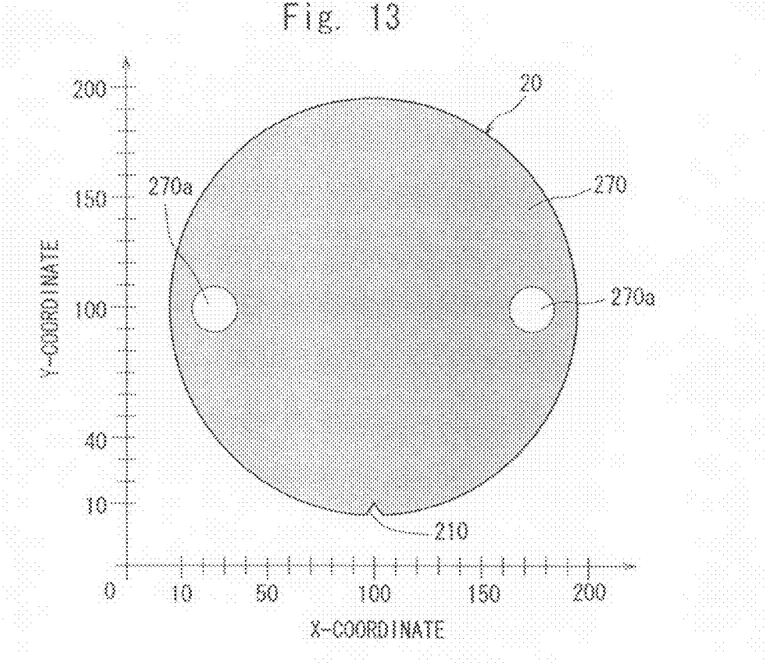
FIG. 13 is an explanatory diagram showing the insulating material removing step in the alignment method of the present invention.

The precise positioning step is carried out by picking up an image of the alignment marks 25 existent on the devices 23 formed on the front surface 21a of the semiconductor wafer 20 and correcting the position in the turning direction of the semiconductor wafer 20 based on the image of the alignment marks 25. Since the insulating material 27 which is an epoxy-based resin coated on the rear surface 21b of the substrate 21 of the semiconductor wafer 20 does not transmit visible radiation and infrared radiation as described above, an image of the alignment marks 25 cannot be picked up by the image pick-up means 7. In the present invention, as shown in FIG. 13, the insulating film 270 at positions (two positions on a straight line in the X direction in the illustrated embodiment) where the alignment marks 25 (their design values are pre-stored in the random access memory (RAM) 103 of the control means 10) as a key pattern having the predetermined position relationship with the notch 210 formed at the outer periphery of the semiconductor wafer 20 are existent is removed (insulating material removing step).

In this insulating material removing step, the chuck table 36 is first activated to bring the location of each of the alignment marks 25 as the key pattern to a position right below the condenser 65. The laser beam application means 52 is then activated to carry out trepanning process for moving the spot S of a pulse laser beam spirally as shown in FIG. 3(b). It is desirable that the energy density per pulse of the pulse laser beam applied for this trepanning process be set to 1.62 to 4.8 J/cm² which can remove the insulating film 270 made of an epoxy-based resin in the area of the alignment mark 25 without processing the substrate 21 made of silicon.

The processing conditions in the insulating material removing step are set as follows.

Light source of laser beam: YVO4 laser or YAG laser
Wavelength: 355 nm
Repetition frequency: 50 kHz
Energy density per pulse: 3.18 J/cm²
Spot diameter: 100 μm The insulating film 270 in an area of 360 μm in diameter could be removed by carrying out trepanning process under the above processing conditions to apply 2,360 pulses of the pulse laser beam, and the insulating film 270 in an area of 1,000 μm in diameter could be removed by applying 25,000 pulses of the pulse laser beam.

Figure 14:
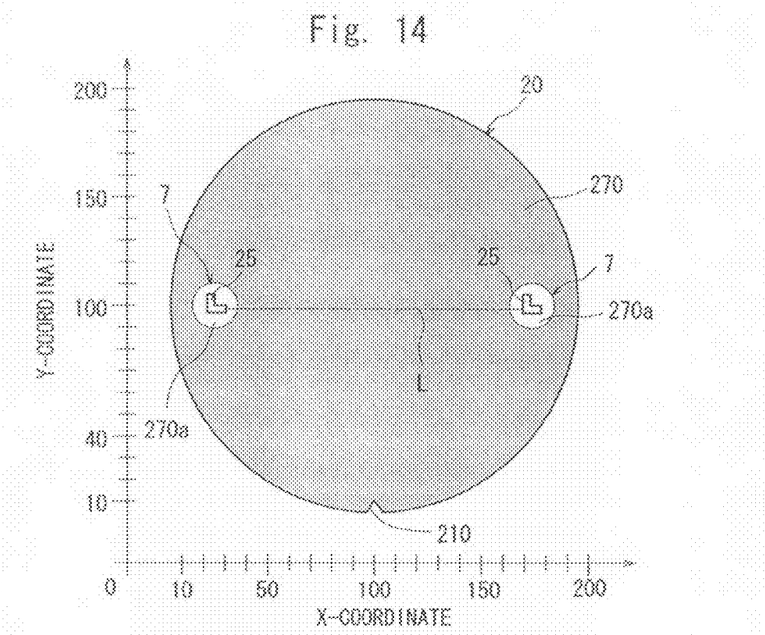
FIG. 14 is an explanatory diagram showing the precision positioning step in the alignment method of the present invention.

After the above insulating material removing step, the chuck table 36 is moved to bring one of the above areas from which the insulating film 270 has been removed, to a position right below the image pick-up means 7. The image pick-up means 7 picks up an image of the area (an image of the alignment mark 25 can be picked up with infrared radiation) and supplies the image data to the control means 10. Thereafter, the chuck table 36 is moved to bring the other area from which the insulating film 270 has been removed, to a position right below the image pick-up means 7, and image data obtained by the image pick-up means 7 is supplied to the control means 10. The control means 10 judges whether the straight line L connecting the two alignment marks 25 is parallel to the X axis based on the image data on the two areas obtained by the image pick-up means 7 as shown exaggeratedly in FIG. 14. When the above straight line L is not parallel to the X axis, the chuck table 36 is turned to make the straight L parallel to the X axis (precision positioning step). By carrying out this precision positioning step, the semiconductor wafer 20 suction-held on the chuck table 36 is located at the coordinate position shown in FIG. 7(a), thereby completing the alignment work.

After the above precision positioning step is carried out to complete the alignment work, next comes the step of forming second holes reaching the bonding pads 24 in the insulating material 27 by applying a pulse laser beam to the insulating material 27 filled in the first holes 26 formed in the substrate 21 of the semiconductor wafer 20.

Figure 15:
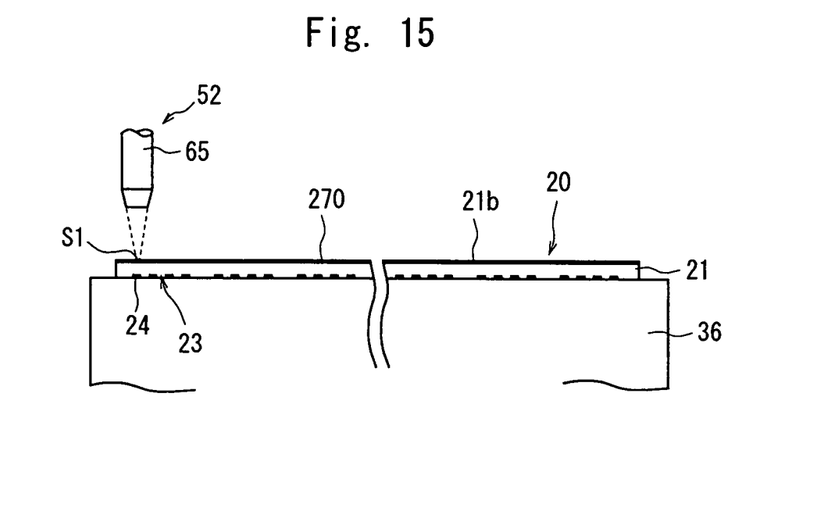
FIG. 15 is an explanatory diagram showing the second hole forming step which is carried out by using the laser beam processing machine shown in FIG. 1.

This second hole forming step is carried out by moving the chuck table 36 as shown in FIG. 15 to bring a device 23 at the most left end in FIG. 15 out of the plurality of devices 23 formed in a predetermined direction on the substrate 21 of the semiconductor wafer 20 to a position right below the condenser 65. Then, a bonding pad 24 at the most left end out of the plurality of bonding pads 24 formed on the device 23 at the most left end in FIG. 15 is brought to a position right below the condenser 65. This positioning work is carried out by moving the chuck table 36 based on the design values of the coordinates of the bonding pads 24 stored in the random access memory (RAM) 103 of the control means 10, like the above first hole forming step. As a result, the center of the first hole 26 (filled with the insulating material 27) formed in the substrate 21 corresponding to the bonding pad 24 is positioned right below the condenser 65.

Next comes the step of forming the second holes reaching the bonding pads 24 by activating the laser beam application means 52 to apply a pulse laser beam from the insulating film 270 side, made of an epoxy-based resin, coated on the rear surface 21b of the substrate 21 of the semiconductor wafer 20 from the condenser 65 of the laser beam application means 52. To carry out this second hole forming step, RF having a frequency of, for example, 10 kHz is applied to the first acousto-optic device 631 of the first acousto-optic deflection means 63 such that the optical axis of the pulse laser beam LB oscillated from the pulse laser beam oscillation means 61 is focused at the focal point Pa, as shown by the solid line in FIG. 2.

Thereafter, a pulse laser beam having a spot diameter of 0.75 to 0.9D when the diameter of the via hole to be formed is represented by D and an energy density per pulse of 25 to 35 J/cm² is applied to the insulating film 270 side, made of an epoxy-based resin, coated on the rear surface 21b of the substrate 21 of the semiconductor wafer 20. That is, the energy density of the pulse laser beam applied from the condenser 65 of the laser beam application means 52 is set to a level (25 to 35 J/cm² per pulse) which can process the insulating material 27 which is an epoxy-based resin efficiently but hardly processes the bonding pad 24 made of metal, and a predetermined number of pulses are applied to the insulating film 270 coated on the rear surface 21b of the substrate 21.

The processing conditions in the second hole forming step are set as follows.

Figure 16:
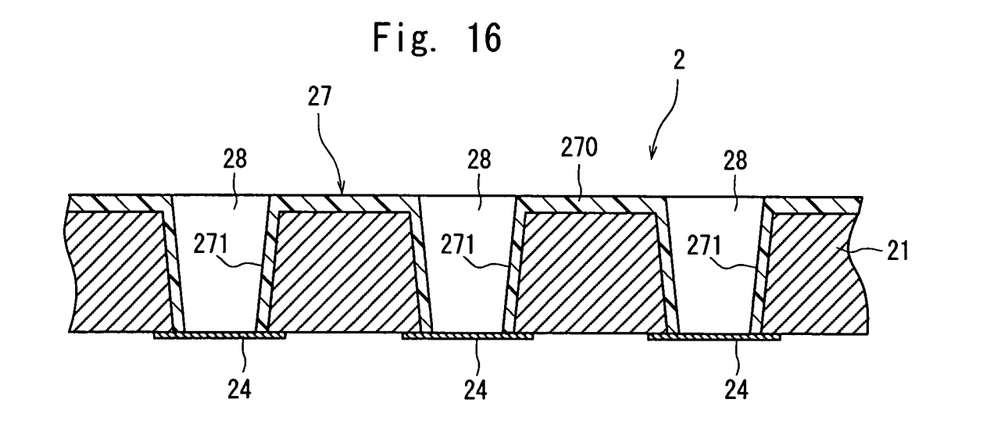
FIG. 16 is a partially enlarged view of the semiconductor wafer having second holes which have been formed by the second hole forming step shown in FIG. 15.

Light source of laser beam: YVO4 laser or YAG laser
Wavelength: 355 nm
Repetition frequency: 50 kHz
Energy density per pulse: 30 J/cm²
Spot diameter: 80 μm Under the above processing conditions, when the insulating material 27 is an epoxy-based resin, as shown in FIG. 15, a hole having a depth of 6 μm can be formed with one pulse of the pulse laser beam by setting the spot S1 having the above spot diameter to the top surface of the insulating film 270 coated on the rear surface 21b of the substrate 21. Therefore, by applying 20 pulses of the pulse laser beam, a second hole 28 reaching the bonding pad 24 is formed in the insulating material 27 filled in the first holes 26 formed in the substrate 21 of the semiconductor wafer 20 as shown in FIG. 16, thereby making it possible to form an insulating film 271 having a thickness of about 10 μm on the inner walls of the first holes 26. The above second hole forming step is carried out at positions corresponding to all the bonding pads 24 formed on the semiconductor wafer 20. Although an electrode made of a metal such as copper is inserted into the second holes 28 having the insulating film 271 formed on the inner walls, the metal atoms of the electrode do not diffuse into the inside of the substrate 21 made of silicon.

As described above, in the illustrated embodiment, the alignment work consisting of the rough positioning step, the insulating material removing step and the precision positioning step is carried out, and the second hole forming step is carried out after the semiconductor wafer 20 suction-held on the chuck table 36 is located at the coordinate position shown in FIG. 7(a). Therefore, the second hole 271 can be formed at the center of the insulating material 27 filled in the first holes 26 formed in the substrate 21 of the semiconductor wafer 20.

While the alignment method of the present invention is applied to the formation of via holes, it can also be applied to laser-processing along the streets 22 formed on the semiconductor wafer 20.

What is claimed is:

1. An alignment method of a laser beam processing machine for laser-processing a wafer having a mark indicating crystal orientation at the outer periphery and an insulating film on the processed surface, the laser beam processing machine comprising a rotatable chuck table for holding a workpiece, a laser beam application means having a condenser for applying a laser beam to the workpiece held on the chuck table, a processing-feed means for moving the chuck table and the laser beam application means relative to each other in a processing-feed direction (X direction), an indexing-feed means for moving the chuck table and the laser beam application means in an indexing-feed direction (Y direction) perpendicular to the processing-feed direction, an image pick-up means for picking up an image of the workpiece held on the chuck table and a control means having a memory for storing the specifications of the workpiece, the method comprising:

a wafer specification storing step for storing the design coordinates of a processing position set based on the mark indicating the crystal orientation of a wafer and alignment marks;

a rough positioning step for picking up an image of the outer periphery of the wafer held on the chuck table with the image pick-up means and turning the chuck table to bring the mark indicating the crystal orientation of the wafer to a predetermined position;

an insulating film removing step for bringing the design coordinate position of each of the alignment marks set based on the mark indicating the crystal orientation of the wafer which has undergone the above rough positioning step to a position right below the condenser and activating the laser beam application means to applying a laser beam from the condenser so as to remove the insulating film in the alignment mark areas; and a precision positioning step for picking up an image of the alignment marks area, from which the insulating film has been removed by the insulating film removing step, with the image pick-up means and adjusting the coordinates of the processing position of the wafer on the chuck table based on the image of the alignment marks picked up.

* * * * *